US 008692381B1

(12) United States Patent
Hart

(10) Patent No.: US 8,692,381 B1
(45) Date of Patent: Apr. 8, 2014

(54) INTEGRATED CIRCUITS WITH A RESISTANCE TO SINGLE EVENT UPSET OCCURRENCE AND METHODS FOR PROVIDING THE SAME

(75) Inventor: Michael J. Hart, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 178 days.

(21) Appl. No.: 12/985,918

(22) Filed: Jan. 6, 2011

(51) Int. Cl.
*H01L 27/108* (2006.01)

(52) U.S. Cl.
USPC ............ 257/774; 438/629; 438/672; 438/675

(58) Field of Classification Search
USPC .......................... 257/774; 438/629, 672, 675
See application file for complete search history.

(56) References Cited

U.S. PATENT DOCUMENTS

| | | | |
|---|---|---|---|
| 4,688,063 A * | 8/1987 | Lu et al. ........................ | 257/304 |
| 6,333,532 B1 * | 12/2001 | Davari et al. .................. | 257/301 |
| 6,507,511 B1 * | 1/2003 | Barth et al. .................... | 365/154 |
| 6,964,897 B2 * | 11/2005 | Bard et al. ..................... | 438/243 |
| 6,975,041 B2 * | 12/2005 | Hirano et al. ................. | 257/393 |
| 7,084,483 B2 * | 8/2006 | Aitken et al. .................. | 257/536 |
| 7,397,692 B1 * | 7/2008 | Cannon et al. ................ | 365/154 |
| 7,452,765 B1 | 11/2008 | Voogel et al. | |
| 7,816,728 B2 * | 10/2010 | Ho et al. ........................ | 257/330 |
| 7,951,666 B2 * | 5/2011 | Ho et al. ........................ | 438/246 |
| 7,965,540 B2 * | 6/2011 | Cannon et al. ................ | 365/156 |
| 8,242,604 B2 * | 8/2012 | Volant et al. .................. | 257/774 |
| 2011/0095373 A1 * | 4/2011 | Hwang et al. ................. | 257/368 |
| 2011/0304008 A1 * | 12/2011 | Yang ............................. | 257/506 |

* cited by examiner

*Primary Examiner* — Eugene Lee
(74) *Attorney, Agent, or Firm* — Julie Mar-Spinola; Gerald Chan; Lois D. Cartier

(57) ABSTRACT

Integrated circuits and methods for reducing the Single Event Upset (SEU) susceptibility of a memory cell are disclosed. By using one or more Through Silicon Vias (TSVs) as capacitor(s) coupled to the Q and/or Qbar nodes of the memory cell, the critical charge (Qcrit) of the circuit is increased. In so doing, the memory cell has greater resistance to an SEU occurrence and reduced sensitivity to neutron and alpha or other charged particle events. The capacitor(s) can be coupled between the Q or Qbar node(s) and a silicon substrate, or between the Q and Qbar nodes, for example.

18 Claims, 4 Drawing Sheets

INTEGRATED CIRCUITS WITH A RESISTANCE TO SINGLE EVENT UPSET OCCURRENCE AND METHODS FOR PROVIDING THE SAME

FIELD OF THE INVENTION

The present invention relates generally to integrated circuits, and more specifically to circuits that are resistant to single event upset occurrences.

BACKGROUND

A programmable device (PD) is a well-known type of integrated circuit (IC) that may be programmed by a user to perform specified logic functions. There are different types of programmable devices, such as programmable logic arrays (PLAs) and complex programmable logic devices (CPLDs). One type of programmable device, called a field programmable gate array (FPGA), is very popular because of a superior combination of capacity, flexibility, time-to-market, and cost. An FPGA typically includes an array of configurable logic blocks (CLBs) and programmable input/output blocks (IOBs). The CLBs and IOBs are interconnected by a programmable interconnect structure. The CLBs, IOBs, and interconnect structure are typically programmed by loading a stream of configuration data (bitstream) from an external source into internal configuration memory cells that define how the CLBs, IOBs, and interconnect structure are configured. Thus, the collective states of the individual configuration memory cells determine the function of the FPGA.

A well-studied occurrence in circuitry is called Single Event Upset (SEU). SEU is an inadvertent change in state of a circuit caused by external energy source such as, for example, cosmic rays, alpha particles, energetic neutrons, and the like. The energetic particles may randomly strike a semiconductor device and penetrate into the active regions (e.g., transistor source and drain regions) of the semiconductor device. These particle strikes create pairs of electrons and holes, which in turn cause undesirable transients that may upset circuit elements such as, for example, flipping the logic state of a latch or other memory element. Such an upset will result in data corruption and can lead to system corruption or failure. As fabrication geometries and supply voltages continue to decrease and circuit densities and transistor counts continue to increase, SEU problems become more severe.

The sensitivity of a static ram (SRAM) cell to incident neutron or alpha or other charged particles depends upon a number of factors, including the critical charge (Qcrit) and the SRAM cell target area. Qcrit is a measure of the charge required to flip the state of an SRAM cell or latch and depends upon many factors, including the capacitance on the cross-coupled nodes of the SRAM cell or latch. Efforts to maximize Qcrit and minimize target area can lead to lowered SEU susceptibility. However, these two factors are often working in opposition. While the scaling of technology will reduce the target area, it will also lead to significantly reduced capacitance, and hence reduced Qcrit. Hence, SEU rates may increase from one technology generation to the next (e.g., 45 nm to 32 nm).

It may be necessary to develop special non-standard processes to maximize the Qcrit for small area cells, in order to keep the SEU rate at an acceptable level. Such non-standard processes have been demonstrated to increase Qcrit and hence improve the SEU. However, a solution that uses commonly available processes utilized in standard CMOS technology (e.g., with few or no additional masks or process steps) would have a clear cost and time-to-market advantage.

There is a need to address the above identified issues. The present invention addresses such a need.

SUMMARY

Integrated circuits and methods for reducing the Single Event Upset (SEU) susceptibility of a memory cell are disclosed. (The term "memory cell" as used herein includes static random access memory (SRAM) cells, latches, and other circuits storing a logical value by using cross-coupled nodes.) By using one or more Through Silicon Vias (TSVs) as capacitor(s) coupled to the Q and/or Qbar nodes of the memory cell, the critical charge (Qcrit) of the circuit is increased. In so doing, the memory cell has greater resistance to an SEU occurrence and reduced sensitivity to neutron and alpha or other charged particle events.

In a first aspect, an integrated circuit comprises a silicon substrate with a plurality of nodes; and one or more through silicon vias (TSV) within the silicon substrate. The plurality of nodes includes Q and Qbar nodes cross-coupled to form a memory cell. The integrated circuit further includes an isolating member surrounding the one or more TSVs for isolating the TSVs from the silicon substrate, wherein one or more capacitors are formed. The one or more capacitors are coupled to at least one of the Q or Qbar nodes.

One or more capacitors may be formed, for example, between the silicon substrate and the at least one of the Q or Qbar nodes. In other embodiments, e.g., embodiments including at least one coaxial TSV, the one or more capacitors may be formed between the Q and Qbar nodes.

In a second aspect, a method comprises providing one or more through silicon vias (TSVs) within a silicon substrate, the silicon substrate including a plurality of nodes; and isolating the one or more TSVs from the silicon substrate, wherein a capacitor is formed. The plurality of nodes includes Q and Qbar nodes cross-coupled to form a memory cell, and the one or more capacitors are coupled to at least one of the Q or Qbar nodes.

In another aspect, an SRAM cell includes a silicon substrate having a Q node and a Qbar node cross-coupled one to another, one or more TSVs within the silicon substrate, and one or more dielectric liners. Each of the dielectric liners surrounds one of the one or more TSVs for isolating the one or more TSVs from the silicon substrate. The one or more TSVs are placed under a metal cross-coupling of the Q node and the Qbar node to form individual capacitors therebetween.

BRIEF DESCRIPTION OF THE DRAWINGS

FIG. 3-1 is a first embodiment of an SRAM cell.
FIG. 3-2 shows a cross-section of FIG. 3-1 through the plane X-X'.
FIG. 4-1 is a second embodiment of an SRAM cell.
FIG. 4-2 shows a cross-section of FIG. 4-1 through the plane Y-Y'.

DETAILED DESCRIPTION

The present invention relates generally to integrated circuits, and more specifically to a circuit that is resistant to single event upset occurrences. The following description is presented to enable one of ordinary skill in the art to make and use the invention, and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The embodiments presented herein are described in the context of SRAM cells. However, one of ordinary skill in the art will readily recognize that the systems and methods described herein can be utilized in a variety of circuits, and that use is within the spirit and scope of the present invention.

Figure 1:
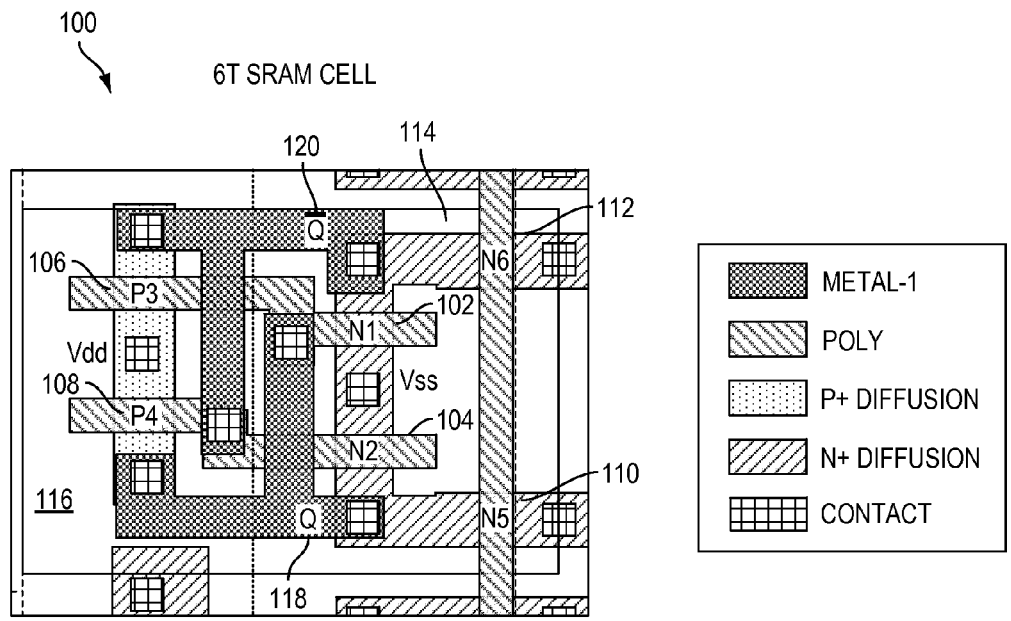
FIG. 1 shows an SRAM cell.

FIG. 1 shows an SRAM cell 100. The SEU FIT (Failures in Time, or the number of failures in one billion hours of operation) rate of a circuit is determined from a number of factors. The SRAM cell 100 includes six transistors 102, 104, 106, 108, 110 and 112 (single port example shown here). NMOS transistors N1, N2, N5, and N6 (102, 104, 110 and 112, respectively) are typically placed in a single PWell 114, and the PMOS transistors P3 and P4 (106 and 108, respectively) are placed in an adjacent Nwell 116. A neutron or alpha or other charged particle incident upon the SRAM cell 100 will create a charge cloud in the Pwell 114 or Nwell 116 regions. The critical charge (Qcrit) required to flip the state of the SRAM cell 100 is calculated for the four possible states of the SRAM cell 100 ('1' state with upset to the 'off' PMOS transistor; '1' state with the upset to the 'off' NMOS' transistor; '0' state with upset to the 'off' PMOS' transistor; '1' state with upset to the 'off' NMOS transistor).

In each case, the relevant Qcrit can be found from a simulation of the dynamic switching response of the SRAM cell 100. Qcrit depends upon the capacitances of the nodes of the SRAM cell 100 (plus other factors), especially on the Q and Qbar nodes 118 and 120 capacitances (and notably on the Q to Qbar capacitance). Adding additional capacitance to the SRAM cell 100 nodes 118 and 120, especially between the cross-coupled Q and Qbar nodes, can increase the Qcrit value and hence reduce the sensitivity to a Single Event Upset (SEU). This approach is illustrated in FIG. 2.

Figure 2:
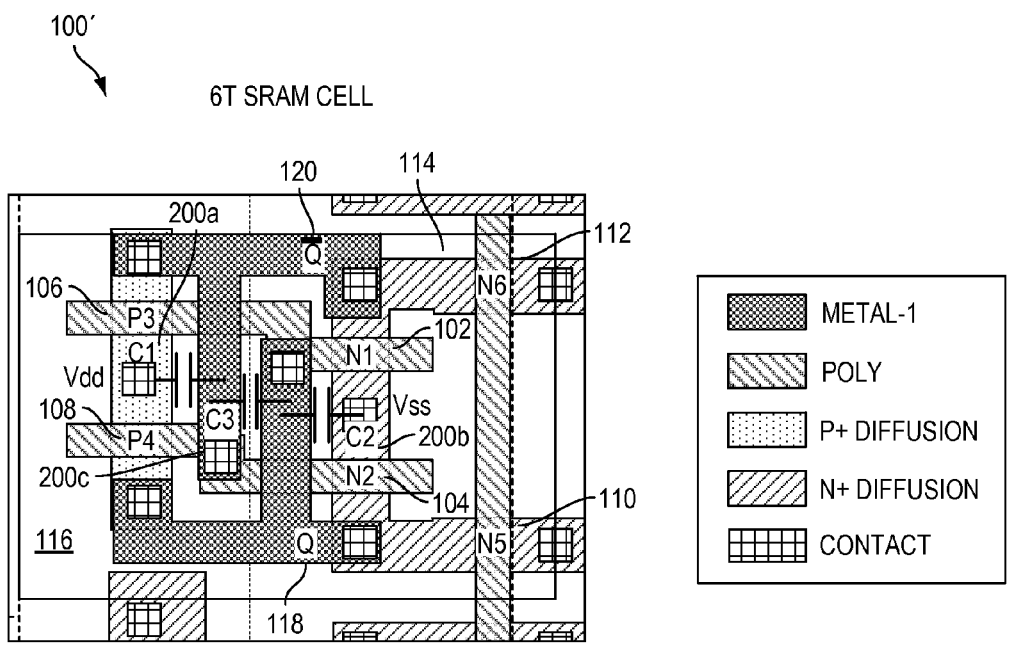
FIG. 2 is an embodiment of the SRAM cell.

FIG. 2 is an embodiment of the SRAM cell 100'. This embodiment has similar elements to the SRAM cell 100 of FIG. 1 and has similar reference numerals. In this embodiment, capacitors C1, C2, and C3 (200a, 200b, and 200c, respectively) are added to Q and Qbar nodes 118 and 120 to minimize the effect of SEUs on the cell 100'. In this embodiment, capacitor 200a is added between power (Vdd) and Qbar node 120, capacitor 200b is added between Q and Qbar nodes 118 and 120, and capacitor 200c is added between the Q node 118 and ground (Vss). Each capacitor can be of a value typically of 5 to 10 fF (femtoFarads), for example, using conventional silicon TSV processing techniques. Such extra capacitance placed on Q or Qbar of an SRAM cell or latch can significantly improve the SEU resistance (i.e., lower the SEU FIT rate).

Each of the capacitors 200a-200c increases Qcrit and hence reduces sensitivity to a SEU. Although it is known that adding capacitance will minimize the SRAM cell's sensitivity to SEUs, simply adding capacitors to the SRAM cell will usually add to overall SRAM cell area & device size. This approach is unacceptable for many applications, as it will increase the cost of the product.

Through Silicon Vias (TSVs) are utilized in 3-dimensional technologies to provide interconnects through silicon devices to allow vertical die stacking. TSVs are usually built to provide electrical connections through the silicon device from front to back of the silicon wafer. Fine pitch TSVs down to 5 micron pitch or below are well known.

According to the methods described herein, to add additional capacitance to a circuit, one or more TSVs are connected to nodes of the circuit to minimize the circuit's sensitivity to an SEU. In an embodiment, the TSVs are used to form capacitors connected to the Q and Qbar nodes 118 and 120. The remaining figures provide detailed exemplary circuits having such structures. Note that while 6-transistor SRAM cells are illustrated, the described techniques can be similarly applied to 8-transistor SRAM cells, for example.

Figures 1, 3:
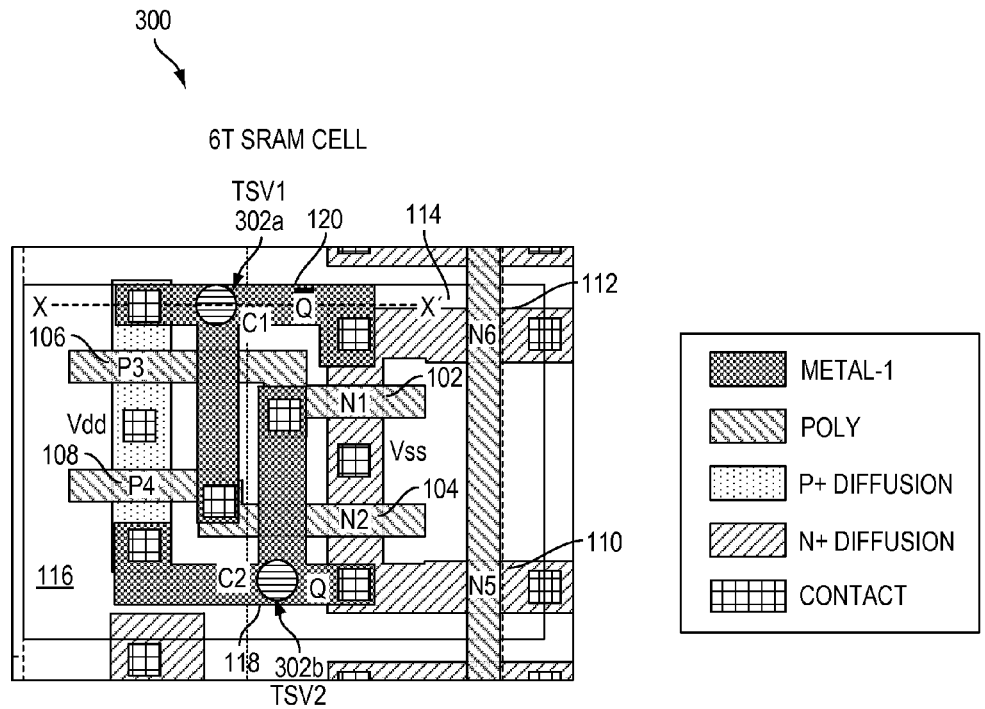
Figures 2, 3:
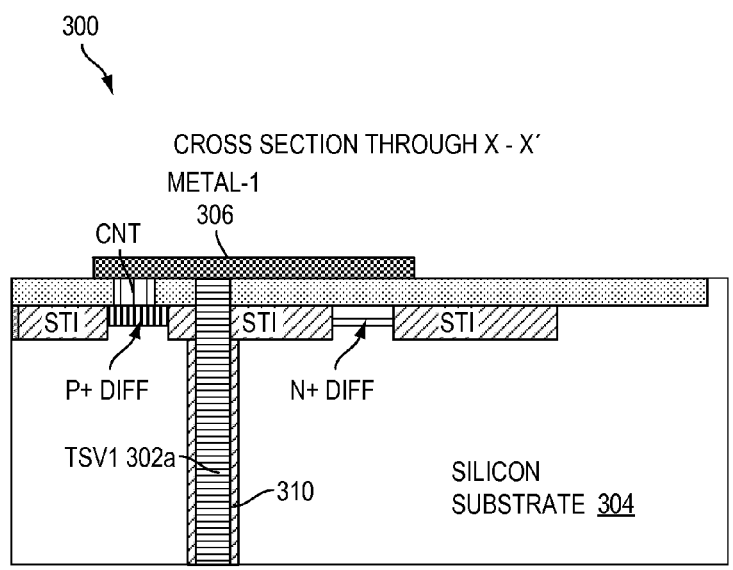

FIG. 3-1 is a first embodiment of an SRAM cell 300. This embodiment has similar elements to the SRAM cell 100 of FIG. 1, and has similar reference numerals. In the embodiment, TSVs TSV1 and TSV2 (302a and 302b, respectively) are utilized as capacitors by placing them under the metal cross coupling connections to the Q and Qbar nodes 118 and 120. Thus, capacitor C1 is added between TSV1 and node Qbar, and capacitor C2 is added between TSV2 and node Q. Thus, TSV1 and TSV2 can be used to provide capacitance to ground in the body of the wafer, for example, as shown in FIG. 3-2.

FIG. 3-2 shows a cross-section of FIG. 3-1 through the plane X-X'. As is seen, TSV1 302a is located within the silicon substrate 304 and is coupled to metal-1 layer 306 (which in this example forms a portion of node Qbar). A liner 310 of dielectric material is utilized to isolate the TSV1 302a from the silicon substrate 304 to form a capacitor to the ground plane in the body of the silicon substrate 304. The dielectric material can be a variety of types, including but not limited to silicon dioxide, a high k dielectric or an organic dielectric. A shallow trench isolation layer or STI, also a dielectric such as silicon dioxide, isolates the wafer from the structures formed on the upper surface thereof.

Figures 1, 4:
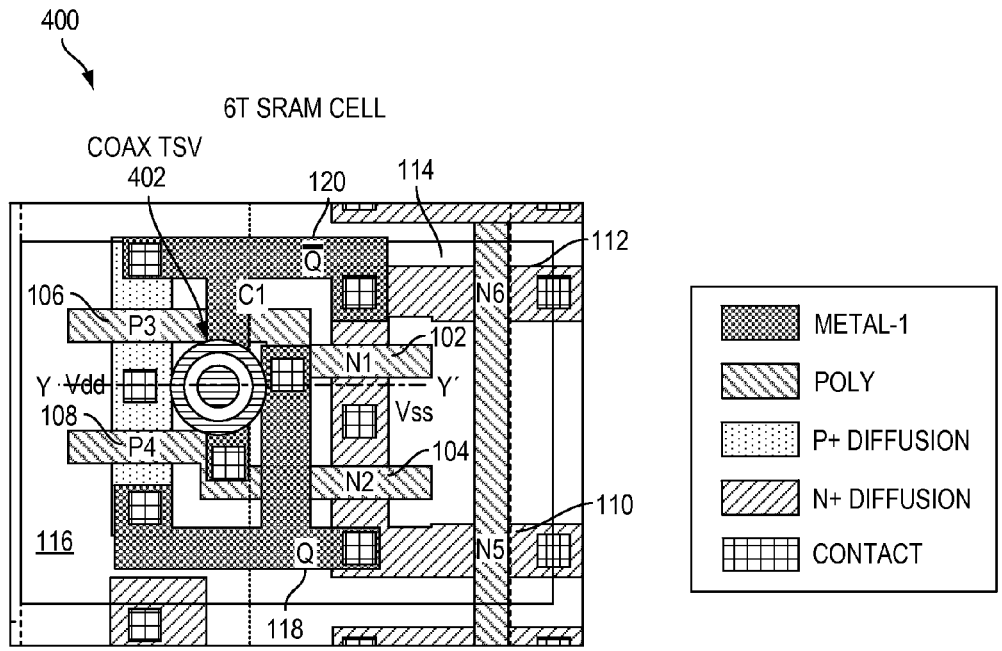
Figures 2, 4:
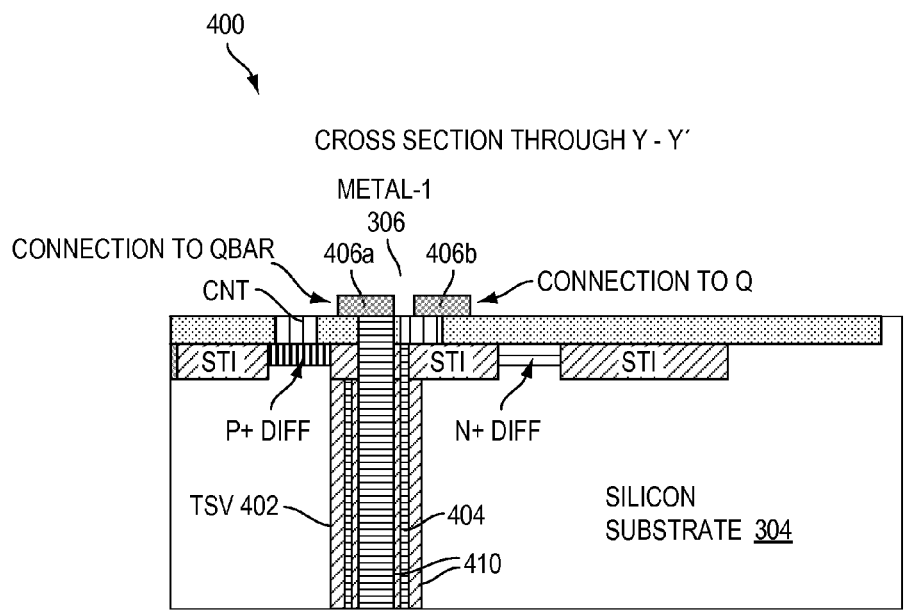

FIG. 4-1 is a second embodiment of an SRAM cell 400 in accordance with another embodiment. This embodiment has similar elements to the SRAM cell 100 of FIG. 1, and has similar reference numerals. In this embodiment, one coaxial TSV 402, comprising a core portion and a coaxial outer portion 404 surrounding the core portion, is placed between the Q and Qbar nodes 118 and 120. The coaxial TSV 402 is placed under the metal cross-coupling, with connections to the Q and Qbar nodes 118 and 120, forming a capacitor directly between the Q and Qbar nodes 118 and 120.

FIG. 4-2 shows a cross-section of FIG. 4-1 through the plane Y-Y'. In this embodiment, a first portion 406a of the metal 1 layer 306 is coupled to the Qbar node 120, and a second portion 406b of the metal layer 306 is coupled to the Q node 118. In this embodiment, the TSV capacitance is provided directly between Q and Qbar. Liner layers 410 of dielectric material isolate the Q and Qbar nodes from one another within the coaxial TSV 402, and from the body of the wafer. The dielectric material can be a variety of types, including but not limited to silicon dioxide, a high k dielectric or an organic dielectric.

Figure 5:
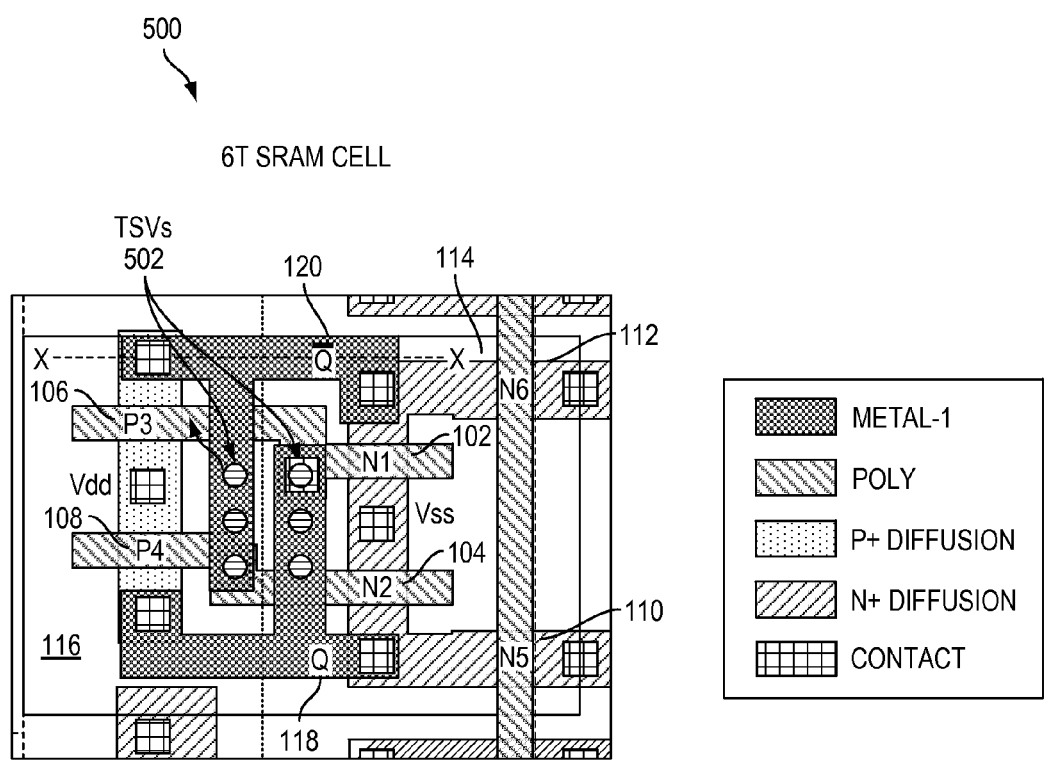
FIG. 5 is a third embodiment of an SRAM cell.

FIG. 5 is a third embodiment of an SRAM cell 500. This embodiment has similar elements to the SRAM cell 100 of FIG. 1, and has similar reference numerals. In this embodiment, SEUs are minimized through the addition of a plurality of arrays of TSVs 502 beneath the Q and Qbar nodes 118 and 120. TSVs 502 can be similar, for example, to TSV1 and TSV2 shown in FIGS. 3-1 and 3-2, or TSV 402 shown in FIGS. 4-1 and 4-2. The arrays of TSVs 502 are placed under the metal cross-coupling connections to the Q and Qbar nodes 118 and 120. Accordingly, the array 502 maximizes the capacitance between the Q and Qbar nodes 118 and 120 and/or between these nodes and the silicon substrate 304.

It should be understood that the one or more TSVs can be utilized in an integrated circuit both for its normal purpose, that is to allow for the vertical stacking of a plurality of dies, as well as adding capacitance to minimize failure rates due to SEU events when utilized on a stacked die. However, the invention is not limited to implementation in stacked die structures.

Although the present invention has been described in accordance with the embodiments shown, one of ordinary skill in the art will readily recognize that there could be variations to the embodiments and those variations are within the spirit and scope of the present invention. For example one or more TSVs can be utilized in a variety of areas on a device, and that use is within the spirit and scope of the present invention. In addition, the present invention is not limited to SRAM cells or to programmable devices, but can be utilized in any latch or other device where a single event update (SEU) is possible and could cause a failure of the device. Accordingly, many modifications may be made by one of ordinary skill in the art without departing from the spirit and scope of the appended claims.

What is claimed is:

1. An integrated circuit, comprising:
   a silicon substrate with a plurality of nodes;
   wherein the plurality of nodes includes Q and Qbar ( ) nodes cross-coupled to form a memory cell;
   one or more through silicon vias (TSVs) within the substrate; and
   an isolating member surrounding the one or more TSVs for isolating the TSVs from the silicon substrate, wherein the one or more TSVs form one or more capacitors between the Q node and the Qbar node to increase a critical charge associated with the memory cell.

2. The integrated circuit of claim 1, wherein the one or more TSVs are placed under a metal cross-coupling of the plurality of nodes.

3. The integrated circuit of claim 1, wherein the one or more capacitors are formed between the silicon substrate and the at least one of the Q or Qbar nodes.

4. The integrated circuit of claim 1, wherein the one or more TSVs comprises at least one coaxial TSV having a first conducting portion a dielectric layer surrounding the central conducing portion, and a second conducting portion surrounding the dielectric layer.

5. The integrated circuit of claim 4, wherein the at least one coaxial TSV comprises an insulator including a metal shield.

6. The integrated circuit of claim 4, wherein:
   the at least one coaxial TSV is placed under a metal cross coupling of the Q node and the Qbar node, and
   the one or more capacitors are formed between the Q node and the Qbar node.

7. The integrated circuit of claim 1, wherein the one or more TSVs comprises at least one array of TSVs.

8. The integrated circuit of claim 1, wherein the silicon substrate comprises one of a plurality of stacked silicon substrates.

9. A method, comprising:
   providing one or more through silicon vias (TSVs) within a silicon substrate, the silicon substrate including a plurality of nodes;
   wherein the plurality of nodes includes Q and Qbar nodes cross-coupled to form a memory cell; and
   isolating the one or more TSVs from the silicon substrate, wherein the one or more TSVs form one or more capacitors between the Q node and the Qbar node to increase a critical charge associated with the memory cell.

10. The method of claim 9, wherein the one or more capacitors are formed between the silicon substrate and the at least one of the Q or Qbar nodes.

11. The method of claim 9, wherein the isolating comprises providing an insulator around each of the one or more TSVs.

12. The method of claim 9, wherein the one or more TSVs comprises at least one coaxial TSV having a first conducting portion, a dielectric layer surrounding the central conducting portion, and a second conducting portion surrounding the dielectric layer.

13. The method of claim 12, wherein:
   the one or more TSVs comprises a TSV placed under a metal cross coupling of the Q node and the Qbar node, and
   the one or more capacitors are formed between the Q node and the Qbar node.

14. An SRAM cell, comprising:
   a silicon substrate having a Q node and a Qbar node cross-coupled one to another;
   one or more through silicon vias (TSVs) within the silicon substrate, wherein at least one of the TSVs is coupled to the Q node or the Qbar node; and
   one or more dielectric liners, each of the one or more dielectric liners surrounding one of the one or more TSVs for isolating the one or more TSVs from the silicon substrate,
   wherein the one or more TSVs are placed under a metal cross-coupling of the node and the Qbar ( ) node to form individual capacitors coupled thereto; and
   wherein at least one of the capacitors is formed between the Q node and the Qbar node to increase a critical charge associated with the SRAM cell.

15. The SRAM cell of claim 14, wherein:
   the one or more TSVs comprises at least one coaxial TSV having a first conducting portion, a dielectric layer surrounding the central conducting portion, and a second conducting portion surrounding the dielectric layer;
   the individual capacitors comprise at least one capacitor formed within the at least one coaxial TSV.

16. The SRAM cell or claim 15, wherein the at least one coaxial TSV comprises a metal shield disposed within at least one of the one or more dielectric liners.

17. The SRAM cell of claim 14, wherein the one or more TSVs comprises at least one array of TSVs.

18. The integrated circuit of claim 1, wherein at least a part of the isolating member is spaced away from the Q or the Qbar.

* * * * *